United States Patent
Oh et al.

(10) Patent No.: US 11,294,429 B2
(45) Date of Patent: Apr. 5, 2022

(54) FLEXIBLE DISPLAY DEVICE INCLUDING HEAT DISSIPATION STRUCTURE

(71) Applicant: Samsung Electronics Co., Ltd., Gyeonggi-do (KR)

(72) Inventors: Hyunchul Oh, Gyeonggi-do (KR); Minsoo Kim, Gyeonggi-do (KR); Hokyung Kang, Gyeonggi-do (KR); Yundong Kim, Gyeonggi-do (KR); Bowoong Seo, Gyeonggi-do (KR); Seokwoo Lee, Gyeonggi-do (KR); Hyunsuk Choi, Gyeonggi-do (KR)

(73) Assignee: Samsung Electronics Co., Ltd

( * ) Notice: Subject to any disclaimer, the term of this patent is extended or adjusted under 35 U.S.C. 154(b) by 161 days.

(21) Appl. No.: 16/870,525

(22) Filed: May 8, 2020

(65) Prior Publication Data
US 2020/0356143 A1  Nov. 12, 2020

(30) Foreign Application Priority Data

May 10, 2019  (KR) .................. 10-2019-0054917

(51) Int. Cl.
*H05K 7/02* (2006.01)
*G06F 1/16* (2006.01)
(Continued)

(52) U.S. Cl.
CPC .......... *G06F 1/1652* (2013.01); *G06F 1/1616* (2013.01); *G06F 1/1681* (2013.01);
(Continued)

(58) Field of Classification Search
CPC .... H05K 1/0209; H05K 1/189; H05K 7/2039; H05K 2201/10128; H05K 7/20963
(Continued)

(56) References Cited

U.S. PATENT DOCUMENTS 6,172,871 B1 * 1/2001 Holung ................ G06F 1/1632
                                                                     165/104.33
6,288,896 B1 * 9/2001 Hsu ........................ G06F 1/182
                                                                     165/104.33
(Continued)

FOREIGN PATENT DOCUMENTS

KR   10-2006-0066981      6/2006
KR   10-2018-0033364      6/2006
(Continued)

OTHER PUBLICATIONS

International Search Report dated Aug. 26, 2020 issued in counterpart application No. PCT/KR2020/005991, 9 pages.

*Primary Examiner* — Sherman Ng
(74) *Attorney, Agent, or Firm* — The Farrell Law Firm, P.C.

(57) ABSTRACT

A flexible display device is provided, which includes a first housing, a second housing, a hinge structure that connects the first housing and the second housing and supports a hinge motion of the first housing or the second housing, a heat source disposed in the first housing, a heat sink disposed in the second housing, and a heat-dissipation path structure disposed across the first housing, the hinge structure, and the second housing. The heat-dissipation path structure transfers heat generated by the heat source to the heat sink.

19 Claims, 13 Drawing Sheets

(51) Int. Cl.
*H05K 7/20* (2006.01)
*H05K 1/18* (2006.01)
*H05K 1/02* (2006.01)

(52) U.S. Cl.
CPC .......... *H05K 1/0209* (2013.01); *H05K 1/189* (2013.01); *H05K 7/2039* (2013.01); *H05K 7/20509* (2013.01); *H05K 2201/10128* (2013.01)

(58) Field of Classification Search
USPC ....................................................... 361/704
See application file for complete search history.

(56) References Cited

U.S. PATENT DOCUMENTS

| | | |
|---|---|---|
| 7,417,863 B2 | 8/2008 | Park |
| 9,609,787 B2 | 3/2017 | Rhee |
| 9,619,008 B2 | 4/2017 | North et al. |
| 10,490,755 B2 | 11/2019 | Jang et al. |
| 2003/0214786 A1* | 11/2003 | Niwatsukino ......... H01L 23/473 361/699 |
| 2009/0207569 A1 | 8/2009 | Tsunoda et al. |
| 2017/0142847 A1 | 5/2017 | Park |
| 2017/0177034 A1 | 6/2017 | North et al. |
| 2018/0092253 A1 | 3/2018 | Qiu et al. |
| 2019/0082544 A1 | 3/2019 | Park |
| 2019/0254194 A1* | 8/2019 | Paavola .................. G06F 1/203 |

FOREIGN PATENT DOCUMENTS

| | | |
|---|---|---|
| KR | 10-2015-0031818 | 3/2015 |
| KR | 1020180062271 | 6/2018 |

\* cited by examiner

FLEXIBLE DISPLAY DEVICE INCLUDING HEAT DISSIPATION STRUCTURE

CROSS-REFERENCE TO RELATED APPLICATION(S)

This application is based on and claims priority under 35 U.S.C. § 119 to Korean Patent Application No. 10-2019-0054917, filed on May 10, 2019, in the Korean Intellectual Property Office, the entire disclosure of which is incorporated herein by reference.

BACKGROUND

1. Field

The disclosure relates generally to a dissipating heat generated from a flexible display device.

2. Description of Related Art

A portable electronic device, such as a smartphone, may provide various functions, such as telephone call, video playback, Internet search, etc., based on various types of applications. A user may prefer the various functions be executed through a wider screen. However, an increase in screen size of a portable device may decrease portability. Accordingly, a portable electronic device using a flexible display has been developed.

In a portable electronic device, an application processor (AP) related to computational operation, a power management integrated circuit (PMIC) related to power supply and battery charging, and a communication processor (CP) related to communication may consume a significant amount of current and generate heat during operation. The heat may cause a problem in the stability of the portable electronic device and the safety of a user (e.g., a low-temperature burn). Therefore, it is important to manage the temperature of a component that generates heat in the portable electronic device.

SUMMARY

The disclosure is provided to address at least the above-mentioned problems and/or disadvantages and to provide at least the advantages described below.

An aspect of the disclosure is to provide a flexible display device including a heat-dissipation path structure extending across a first housing and a second housing to rapidly perform a heat dissipation operation.

In accordance with an aspect of the disclosure, a flexible display device is provided, which includes a first housing, a second housing, a hinge structure that connects the first housing and the second housing and supports a hinge motion of the first housing or the second housing, a heat source disposed in the first housing, a heat sink disposed in the second housing, and a heat-dissipation path structure disposed across the first housing, the hinge structure, and the second housing. The heat-dissipation path structure transfers heat generated by the heat source to the heat sink.

BRIEF DESCRIPTION OF THE DRAWINGS

The above and other aspects, features, and advantages of certain embodiments of the disclosure will be more apparent from the following description taken in conjunction with the accompanying drawings, in which.

With regard to description of the drawings, identical or similar reference numerals may be used to refer to identical or similar components.

DETAILED DESCRIPTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1A:
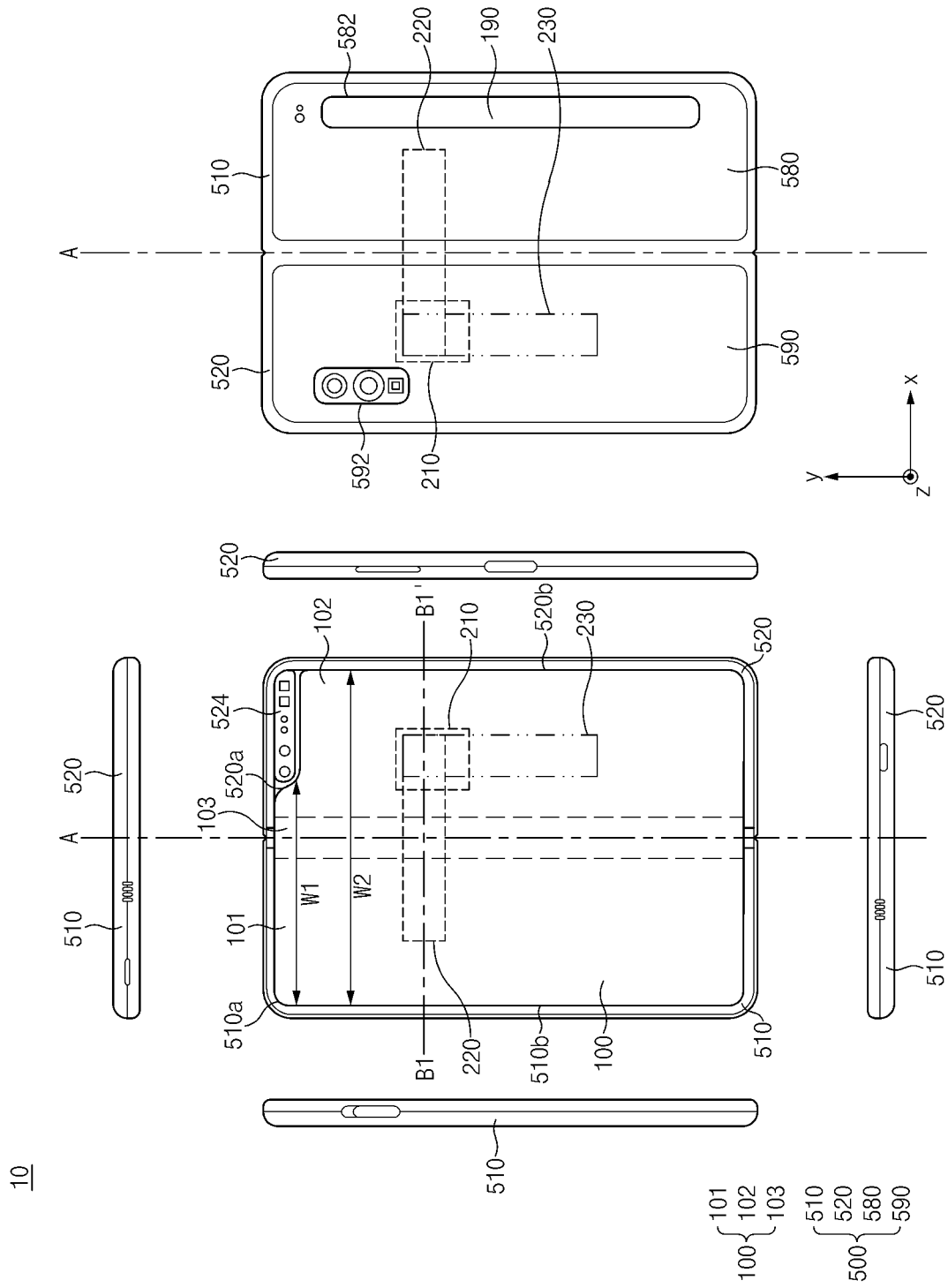
FIG. 1A illustrates a flat state of an electronic device according to an embodiment.
Figure 1B:
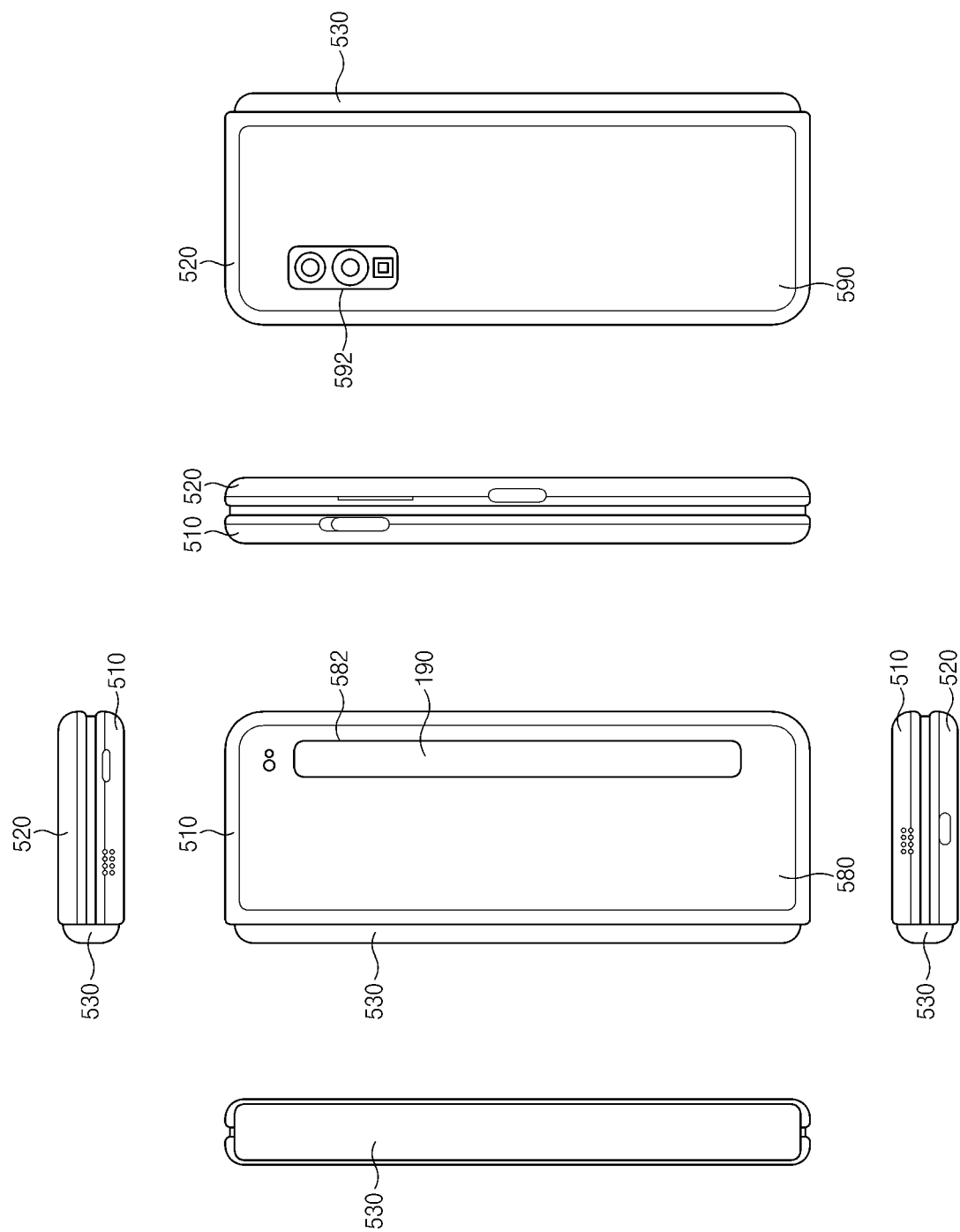
FIG. 1B illustrates a folded state of the electronic device in FIG. 1A according to an embodiment.

FIG. 1A illustrates a flat state of an electronic device according to an embodiment. FIG. 1B illustrates a folded state of the electronic device according to an embodiment.

Referring to FIGS. 1A and 1B, the electronic device 10, which is a flexible display device, includes a foldable housing 500, a hinge cover 530 that covers a foldable portion of the foldable housing 500, and a flexible display 100 that is disposed in a space formed by the foldable housing 500. The flexible display 100 may include a foldable display, a multi-foldable display, or a rollable display. A surface on which the display 100 is disposed is referred to as a first surface or a front surface of the electronic device 10, and an opposite surface to the front surface is referred to as a second surface or a rear surface of the electronic device 10. Surfaces that surround a space between the front surface and the rear surface are referred to as third surfaces or side surfaces of the electronic device 10.

The foldable housing 500 includes a first housing structure 510, a second housing structure 520, a first back cover 580, and a second back cover 590. The second housing structure 520 includes a sensor area 524.

The foldable housing 500 is not limited to the form and coupling illustrated in FIGS. 1A and 1B and may be implemented by a combination and/or coupling of other shapes or parts. For example, the first housing structure 510 and the first back cover 580 may be integrated with each other, and the second housing structure 520 and the second back cover 590 may be integrated with each other.

In FIG. 1A, the first housing structure 510 and the second housing structure 520 are disposed on opposite sides of a folding axis A and are symmetrical with respect to the folding axis A. An angle or distance between the first housing structure 510 and the second housing structure 520 may vary depending on whether the electronic device 10 is in a flat state, a folded state, or an intermediate state.

Unlike the first housing structure 510, the second housing structure 520 includes the sensor area 524 in which various sensors are disposed, but may have a mutually symmetrical shape in the other area.

As illustrated in FIG. 1A, the first housing structure 510 and the second housing structure 520 may form a recess in which the display 100 is received. Due to the sensor area 524, the recess may have different widths in a direction perpendicular to the folding axis A.

For example, the recess has (1) a first width W1 between a first portion 510a of the first housing structure 510 that is parallel to the folding axis A and a first portion 520a of the second housing structure 520 that is formed on the periphery of the sensor area 524 and (2) a second width W2 formed by a second portion 510b of the first housing structure 510 and a second portion 520b of the second housing structure 520 that does not correspond to the sensor area 524 and that is parallel to the folding axis A. The second width W2 is greater than the first width W1. The first portion 510a of the first housing structure 510 and the first portion 520a of the second housing structure 520 that have mutually asymmetrical shapes may form the first width W1 of the recess, and the second portion 510b of the first housing structure 510 and the second portion 520b of the second housing structure 520 that have mutually symmetrical shapes may form the second width W2 of the recess. In an embodiment, the first portion 520a and the second portion 520b of the second housing structure 520 may have different distances from the folding axis A. The widths of the recess are not limited to the illustrated example. The recess may have a plurality of widths due to the form of the sensor area 524 or the asymmetrical portions of the first housing structure 510 and the second housing structure 520.

At least a portion of the first housing structure 510 and at least a portion of the second housing structure 520 may be formed of a metallic material or a non-metallic material that has a stiffness selected to support the display 100.

The sensor area 524 may be formed adjacent to one corner of the second housing structure 520 so as to have a predetermined area. However, the arrangement, shape, and size of the sensor area 524 are not limited to the illustrated example. For example, the sensor area 524 may be provided in another corner of the second housing structure 520 or in any area between an upper corner and a lower corner of the second housing structure 520.

Components of the electronic device 10 may be exposed on the front surface of the electronic device 10 through the sensor area 524 or through one or more openings provided in the sensor area 524. The components may include various types of sensors, e.g., a front camera, a receiver, and/or a proximity sensor.

The first back cover 580 is disposed on the rear surface of the electronic device 10 and located on one side of the folding axis A. For example, the first back cover 580 has a substantially rectangular periphery, which is surrounded by the first housing structure 510. Similarly, the second back cover 590 is disposed on the rear surface of the electronic device 10 and is located on an opposite side of the folding axis A. The periphery of the second back cover 290 is surrounded by the second housing structure 520.

The first back cover 580 and the second back cover 590 have substantially symmetrical shapes with respect to the folding axis A. However, the first back cover 580 and the second back cover 590 do not necessarily have to have mutually symmetrical shapes. Instead, the electronic device 10 may include the first back cover 580 and the second back cover 590 in various shapes.

Alternatively, the first back cover 580 may be integrally formed with the first housing structure 510, and the second back cover 590 may be integrally formed with the second housing structure 520.

The first back cover 580, the second back cover 590, the first housing structure 510, and the second housing structure 520 form a space in which various components (e.g., a printed circuit board (PCB), a battery, etc.) of the electronic device 10 are disposed. One or more components may be disposed, or visually exposed, on the rear surface of the electronic device 10. For example, at least a portion of a sub-display 190 may be visually exposed through a first rear area 582 of the first back cover 580. One or more components or sensors may be visually exposed through a second rear area 592 of the second back cover 590. The sensors may include a proximity sensor and/or a rear camera.

The electronic device 10 includes a heat-dissipation path structure 220 across the first housing structure 510 and the second housing structure 520. For example, the heat-dissipation path structure 220 extends across the folding axis A in a direction (e.g., the X-axis direction) perpendicular to the folding axis A.

A portion of the heat-dissipation path structure 220 may be connected to a heat source 210. For example, a heat dissipation member (e.g., a thermal interface material (TIM)) may be disposed between the portion of the heat-dissipation path structure 220 and the heat source 210. The portion of the heat-dissipation path structure 220 may be connected with (or brought into contact with) one surface of the heat dissipation member. The heat source 210 may be connected with (or brought into contact with) an opposite surface that is opposite to the one surface of the heat dissipation member with which the heat-dissipation path structure 220 is brought into contact. The portion of the heat-dissipation path structure 220 may be directly connected with (or brought into direct contact with) the heat source 210.

A portion of the heat-dissipation path structure 220 may be connected with (or brought into contact with) a heat pipe 230 that diffuses heat. The heat source 210 may be connected with one surface of the heat-dissipation path structure 220, and the heat pipe 230 may be connected with (or brought into contact with) an opposite surface that is opposite to the one surface of the heat-dissipation path structure 220 with which the heat source 210 is connected.

Referring to FIG. 1B, the hinge cover 530 is disposed between the first housing structure 510 and the second housing structure 520 and is configured to hide an internal part (e.g., a hinge structure). The hinge cover 530 may be hidden by a portion of the first housing structure 510 and a portion of the second housing structure 520, or may be exposed to the outside, depending on a state (e.g., a flat state or a folded state) of the electronic device 10.

For example, when the electronic device 10 is in a flat state as illustrated in FIG. 1A, the hinge cover 530 may not be exposed as it is hidden by the first housing structure 510 and the second housing structure 520. However, when the electronic device 10 is in a folded state (e.g., a fully folded state) as illustrated in FIG. 1B, the hinge cover 530 is exposed to the outside from between the first housing structure 510 and the second housing structure 520. When the electronic device 10 is in an intermediate state in which the first housing structure 510 and the second housing structure 520 are folded with a certain angle, i.e., not completely folded or unfolded, the hinge cover 530 may be partially exposed to the outside from between the first housing structure 510 and the second housing structure 520. The hinge cover 530 may include a curved surface.

The display 100 is disposed in the space formed by the foldable housing 500. For example, the display 100 is mounted in the recess formed by the foldable housing 500 and forms almost the entire front surface of the electronic device 10.

The front surface of the electronic device 10 includes the display 100, and a partial area of the first housing structure 510 and a partial area of the second housing structure 520 that are adjacent to the display 100. The rear surface of the electronic device 10 includes the first back cover 580, a partial area of the first housing structure 510 that is adjacent to the first back cover 580, the second back cover 590, and a partial area of the second housing structure 520 that is adjacent to the second back cover 590.

The display 100 refers to a display, at least a partial area of which is capable of being deformed into a flat surface or a curved surface. For example, the display 100 includes a folding area 103, a first area 101 disposed on one side of the folding area 103 (on the left side of the folding area 103 illustrated in FIG. 1A), and a second area 102 disposed on an opposite side of the folding area 103 (on the right side of the folding area 103 illustrated in FIG. 1A).

The division of the display 100 into the areas illustrated in FIG. 1A is illustrative, and the display 100 may be divided into a plurality of areas (e.g., four or more areas, or two areas) depending on the structure or function of the display 100. In FIG. 1A, the areas of the display 100 are divided from each other by the folding area 103 or the folding axis A that extends parallel to the Y axis. Alternatively, the display 100 may be divided into areas with respect to another folding area (e.g., a folding area parallel to the X axis) or another folding axis (e.g., a folding axis parallel to the X axis).

The first area 101 and the second area 102 have shapes that are symmetrical to each other with respect to the folding area 103. However, unlike the first area 101, the second area 102 includes a notch that is cut for the sensor area 524. Accordingly, the first area 101 and the second area 102 may include portions having symmetrical shapes and portions having asymmetrical shapes.

When the electronic device 10 is in a flat state (or unfolded state) as illustrated in FIG. 1, the first housing structure 510 and the second housing structure 520 face the same direction while forming an angle of 180 degrees. Consequently, the surface of the first area 101 and the surface of the second area 102 of the display 100 face the same direction (e.g., the direction toward the front surface of the electronic device 10) while forming an angle of 180 degrees. The folding area 103, together with the first area 101 and the second area 102, may form the same plane.

When the electronic device 10 is in a folded state as illustrated in FIG. 1B, the first housing structure 510 and the second housing structure 520 face each other. The surface of the first area 101 and the surface of the second area 102 of the display 100 face each other while forming a narrow angle (e.g., an angle between 0 degrees and 10 degrees). At least a portion of the folding area 103 may be a curved surface having a predetermined curvature.

When the electronic device 10 is in an intermediate state between the flat state and the folded state, the first housing structure 510 and the second housing structure 520 may be disposed to form a certain angle. The surface of the first area 101 and the surface of the second area 102 of the display 100 may form an angle that is greater than that in the folded state and is smaller than that in the flat state. At least a portion of the folding area 103 may be a curved surface having a predetermined curvature, and the curvature may be smaller than that in the folded state.

Figure 1C:
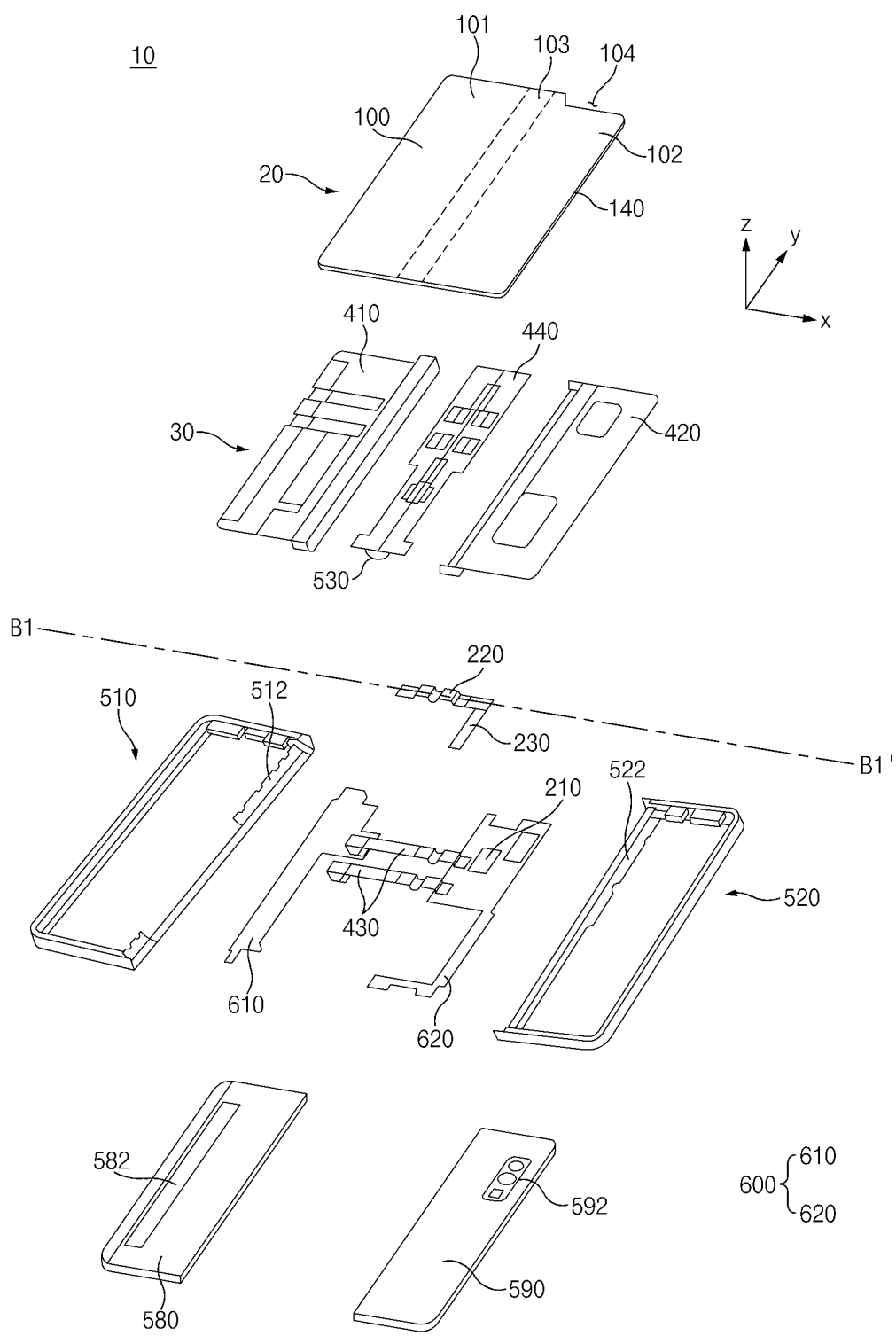
FIG. 1C illustrates an exploded view of an electronic device according to an embodiment.

FIG. 1C illustrates an exploded perspective view of an electronic device according to an embodiment.

Referring to FIG. 1C, the electronic device 10 includes a display unit 20, a bracket assembly 30, a circuit board 600, the first housing structure 510, the second housing structure 520, the first back cover 580, and the second back cover 590. The display unit 20 may be referred to as a display module or a display assembly.

The display unit 20 includes the display 100 and one or more plates or layers 140 on which the display 140 is mounted. The plates 140 may be disposed between the display 100 and the bracket assembly 30. The display 100 may be disposed on at least a portion of one surface of the plates 140 (e.g., the upper surface with respect to FIG. 1C). The plates 140 may be formed in a shape corresponding to the display 100. For example, partial areas of the plates 140 may be formed in a shape corresponding to a notch 104 of the display 100.

The bracket assembly 30 includes a first bracket 410, a second bracket 420, a hinge structure 440 disposed between the first bracket 410 and the second bracket 420, the hinge cover 530 that covers the hinge structure 440 when viewed from the outside, and a wiring member 430 (e.g., a flexible PCB (FPCB)) across the first bracket 410 and the second bracket 420.

The bracket assembly 30 may be disposed between the plates 140 and the circuit board 600. For example, the first bracket 410 may be disposed between the first area 101 of the display 100 and a first circuit board 610. The second bracket 420 may be disposed between the second area 102 of the display 100 and a second circuit board 620.

At least a portion of the wiring member 430 and at least a portion of the hinge structure 440 may be disposed inside the bracket assembly 30. The wiring member 430 may be disposed in a direction (e.g., the X-axis direction) across the first bracket 410 and the second bracket 420. The wiring member 430 may be disposed in a direction (e.g., the X-axis direction) that is perpendicular to a folding axis of the folding area 103 of the electronic device 10 (e.g., the Y axis or the folding axis A of FIG. 1A).

The circuit board 600 includes the first circuit board 610 disposed near the first bracket 410 and the second circuit board 620 disposed near the second bracket 420. The first circuit board 610 and the second circuit board 620 may be disposed in the space that is formed by the bracket assembly 30, the first housing structure 510, the second housing structure 520, the first back cover 580, and the second back cover 590.

Components of the electronic device 10 may be mounted on the first circuit board 610 and the second circuit board 620. For example, the heat source 210 (e.g., an AP, a CP, or a PMIC) that generates a relatively large amount of heat may be mounted on the second circuit board 620. However, the arrangement, shape, and size of the heat source 210 are not limited to the illustrated example. The heat source 210 may be disposed on the first circuit board 610, or may be disposed on both the first circuit board 610 and the second circuit board 620.

The electronic device 10 include the heat-dissipation path structure 220 across the first bracket 410 and the second bracket 420. For example, the heat-dissipation path structure 220 passes through the hinge structure 440 and may be connected with (or brought into contact with) the first bracket 410 and the second bracket 420. The first bracket 410 may include a metal portion and an injection-molded portion. A portion of the heat-dissipation path structure 220 may be connected with the metal portion of the first bracket 410. The second bracket 420 may include a metal portion and an injection-molded portion. A portion of the heat-dissipation path structure 220 may be connected with the metal portion of the second bracket 420. The metal portion of the first bracket 410 or the metal portion of the second bracket 420 may serve as a heat sink.

A portion of the heat-dissipation path structure 220 may be connected to the heat source 210. For example, a heat dissipation member (e.g., a TIM) may be disposed between the portion of the heat-dissipation path structure 220 and the heat source 210. The portion of the heat-dissipation path structure 220 may be connected with one surface of the heat dissipation member. The heat source 210 may be connected with an opposite surface that is opposite to the one surface of the heat dissipation member with which the heat-dissipation path structure 220 is brought into contact. The portion of the heat-dissipation path structure 220 may be directly connected with the heat source 210.

A portion of the heat-dissipation path structure 220 may be connected with the heat pipe 230 that diffuses heat. The heat source 210 may be connected with one surface of the heat-dissipation path structure 220, and the heat pipe 230 may be connected with an opposite surface that is opposite to the one surface of the heat-dissipation path structure 220 with which the heat source 210 is connected.

The heat-dissipation path structure 220 may be disposed between the first bracket 410 and the second bracket 420 through a path that is the same as, or similar to, that of the wiring member 430.

The first housing structure 510 and the second housing structure 520 may be assembled together and coupled to opposite sides of the bracket assembly 30 in a state in which the display unit 20 is coupled to the bracket assembly 30. The first housing structure 510 and the second housing structure 520 may be coupled with the bracket assembly 30 by being slid on the opposite sides of the bracket assembly 30.

The first housing structure 510 includes a first rotation support surface 512, and the second housing structure 520 includes a second rotation support surface 522 corresponding to the first rotation support surface 512. The first rotation support surface 512 and the second rotation support surface 522 may include a curved surface corresponding to a curved surface included in the hinge cover 530.

When the electronic device 10 is in the flat state as illustrated in FIG. 1A, the first rotation support surface 512 and the second rotation support surface 522 may cover the hinge cover 530 such that the hinge cover 530 is not exposed, or is minimally exposed, on the rear surface of the electronic device 10. When the electronic device 10 is in the folded state as illustrated in FIG. 1B, the first rotation support surface 512 and the second rotation support surface 522 may rotate along the curved surfaces included in the hinge cover 530 such that the hinge cover 530 is exposed on the rear surface of the electronic device 10.

Figure 2:
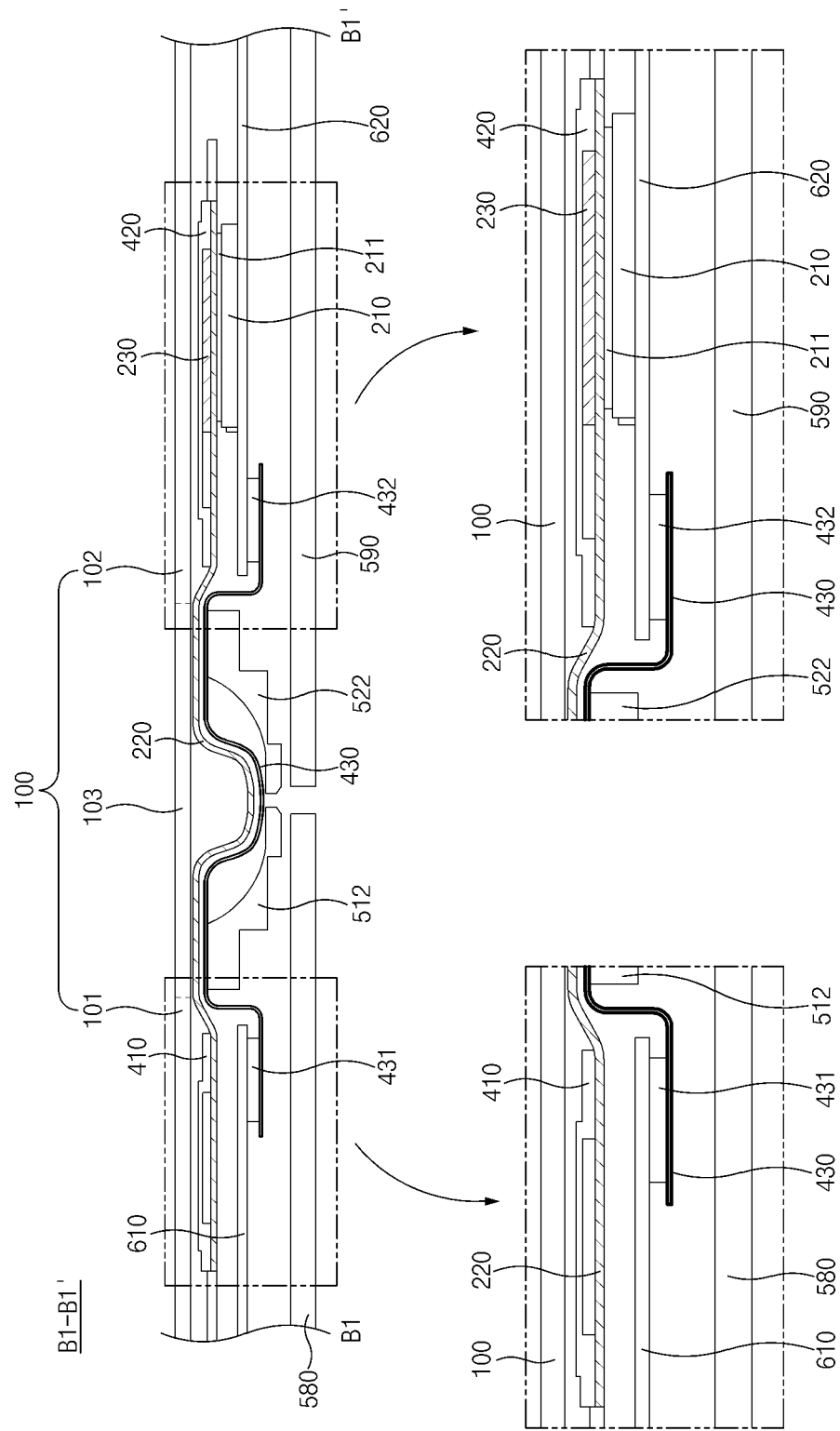
FIG. 2 illustrates a sectional view of the electronic device in FIG. 1A taken along line B1-B1', according to an embodiment.

FIG. 2 illustrates a sectional view of the electronic device in FIG. 1A taken along line B1-B1', according to an embodiment.

Referring to FIGS. 1A, 1C, and 2, the electronic device 10 includes the first circuit board 610 disposed near the first bracket 410 and the second circuit board 620 disposed near the second bracket 420. The first circuit board 610 is disposed between the first back cover 580 and the first bracket 410. The second circuit board 620 is disposed between the second back cover 590 and the second bracket 420. The electronic device 10 includes the wiring member 430 (e.g., an FPCB) across the first bracket 410 and the second bracket 420 through the hinge structure 440. The wiring member 430 is connected with the first circuit board 610 through a first connector 431 and is connected with the second circuit board 620 through a second connector 432.

Various components of the electronic device 10 may be mounted on the first circuit board 610 and the second circuit board 620. For example, the heat source 210 (e.g., an AP, a CP, or a PMIC) that generates a relatively large amount of heat is mounted on the second circuit board 620. However, the arrangement, shape, and size of the heat source 210 are not limited to the illustrated example. The heat source 210 may be disposed on the first circuit board 610, or may be disposed on both the first circuit board 610 and the second circuit board 620.

The electronic device 10 includes the heat-dissipation path structure 220 across the first bracket 410 and the second bracket 420. For example, the heat-dissipation path structure 220 passes through the hinge structure 440 and is connected with (or brought into contact with) the first bracket 410 and the second bracket 420. The first bracket 410 may include a metal portion and an injection-molded portion. A portion of the heat-dissipation path structure 220 may be connected with (or brought into contact with) the metal portion of the first bracket 410. The second bracket 420 may include a metal portion and an injection-molded portion. A portion of the heat-dissipation path structure 220 may be connected with the metal portion of the second bracket 420. The metal portion of the first bracket 410 or the metal portion of the second bracket 420 may serve as a heat sink.

A portion of the heat-dissipation path structure 220 may be connected to the heat source 210. For example, a heat dissipation member 211 (e.g., a TIM) is disposed between the portion of the heat-dissipation path structure 220 and the heat source 210. The portion of the heat-dissipation path structure 220 may be connected with one surface of the heat dissipation member 211. The heat source 210 may be connected with an opposite surface that is opposite to the one surface of the heat dissipation member 211 with which the heat-dissipation path structure 220 is brought into contact. The portion of the heat-dissipation path structure 220 may be directly connected with (or brought into direct contact with) the heat source 210.

A portion of the heat-dissipation path structure 220 may be connected with the heat pipe 230 that diffuses heat. The heat source 210 may be connected with one surface of the heat-dissipation path structure 220, and the heat pipe 230 may be connected with an opposite surface that is opposite to the one surface of the heat-dissipation path structure 220 with which the heat source 210 is connected.

The heat-dissipation path structure 220 may be disposed between the first bracket 410 and the second bracket 420 through a path that is the same as, or similar to, that of the wiring member 430.

The heat-dissipation path structure 220 may be formed in a layered structure including a plurality of layers. For example, the heat-dissipation path structure 220 may include a heat conduction layer formed of a material (e.g., graphite, copper, or the like) that has a relatively high heat transfer rate and one or more cover layers for maintaining the stiffness of the heat conduction layer. The cover layers may be disposed on the top and bottom of the heat conduction layer. The cover layers disposed on the top and bottom of the heat conduction layer may be disposed to surround the heat conduction layer in a sealed pouch form. The thicknesses of the cover layers may partially vary depending on a location on the heat-dissipation path structure 220. In a portion of the heat-dissipation path structure 220 that corresponds to the hinge structure 440, the cover layers may be thicker than in a portion of the heat-dissipation path structure 220 that corresponds to the first bracket 410 or the second bracket 420. In the thicker portions of the cover layers, the cover layers may be constituted by a plurality of cover layers.

The heat-dissipation path structure 220 may diffuse, through the heat conduction layer, heat generated from the heat source 210. On one side of the second bracket 420, the heat-dissipation path structure 220 may diffuse the generated heat. For example, the generated heat is transferred to the heat-dissipation path structure 220 through the heat dissipation member 211. The heat-dissipation path structure 220 diffuses the heat transferred from the heat source 210. The heat-dissipation path structure 220 may transfer the transferred heat to the heat pipe 230. On one side of the second bracket 420, the heat pipe 230 may diffuse the transferred heat. The heat-dissipation path structure 220 may diffuse the transferred heat through the metal portion of the second bracket 420.

The heat-dissipation path structure 220 may diffuse the transferred heat toward the first bracket 410. For example, the heat-dissipation path structure 220 diffuses the transferred heat toward the first bracket 410 through the hinge structure 440. The heat-dissipation path structure 220 may diffuse the transferred heat through the metal portion of the first bracket 410.

As described above, the electronic device 10 may diffuse the heat generated from the heat source 210, i.e., a component that is located near the second bracket 420, toward the first bracket 410 through the heat-dissipation path structure 220, and the heat dissipation performance of the electronic device 10 may be improved.

Figure 3:
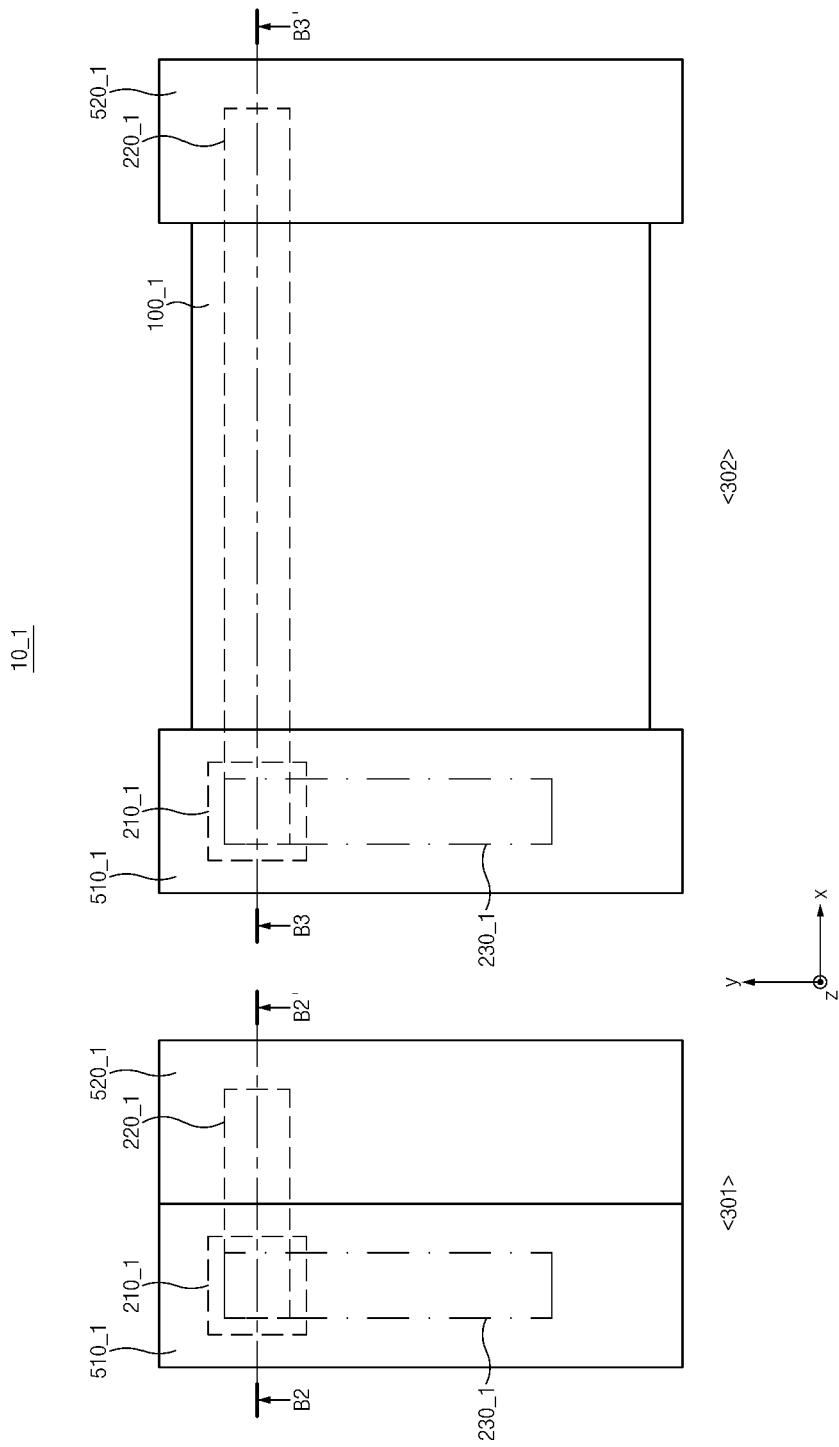
FIG. 3 illustrates an electronic device according to an embodiment.
Figure 4A:
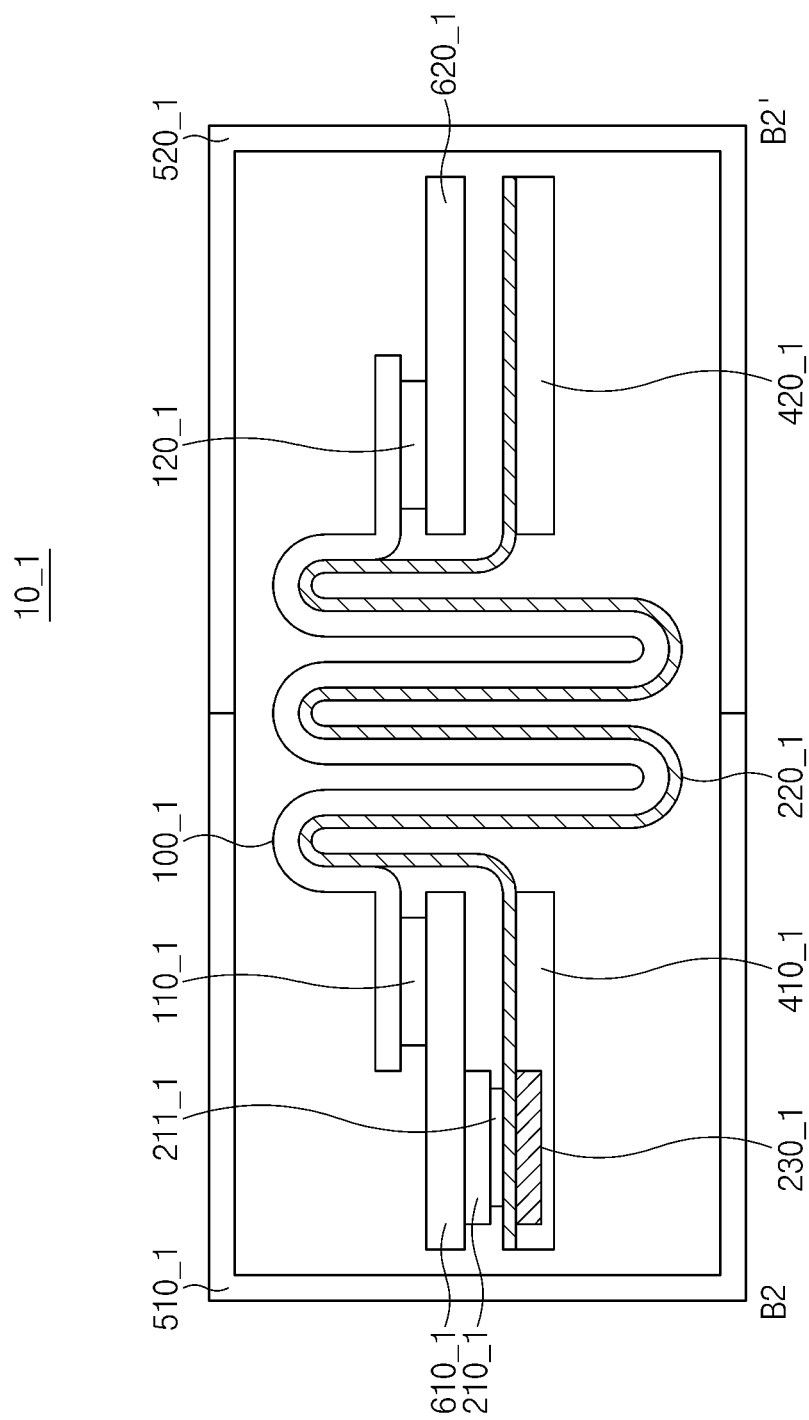
FIG. 4A illustrates a sectional view of the electronic device in FIG. 3 taken along line B2-B2', according to an embodiment.
Figure 4B:
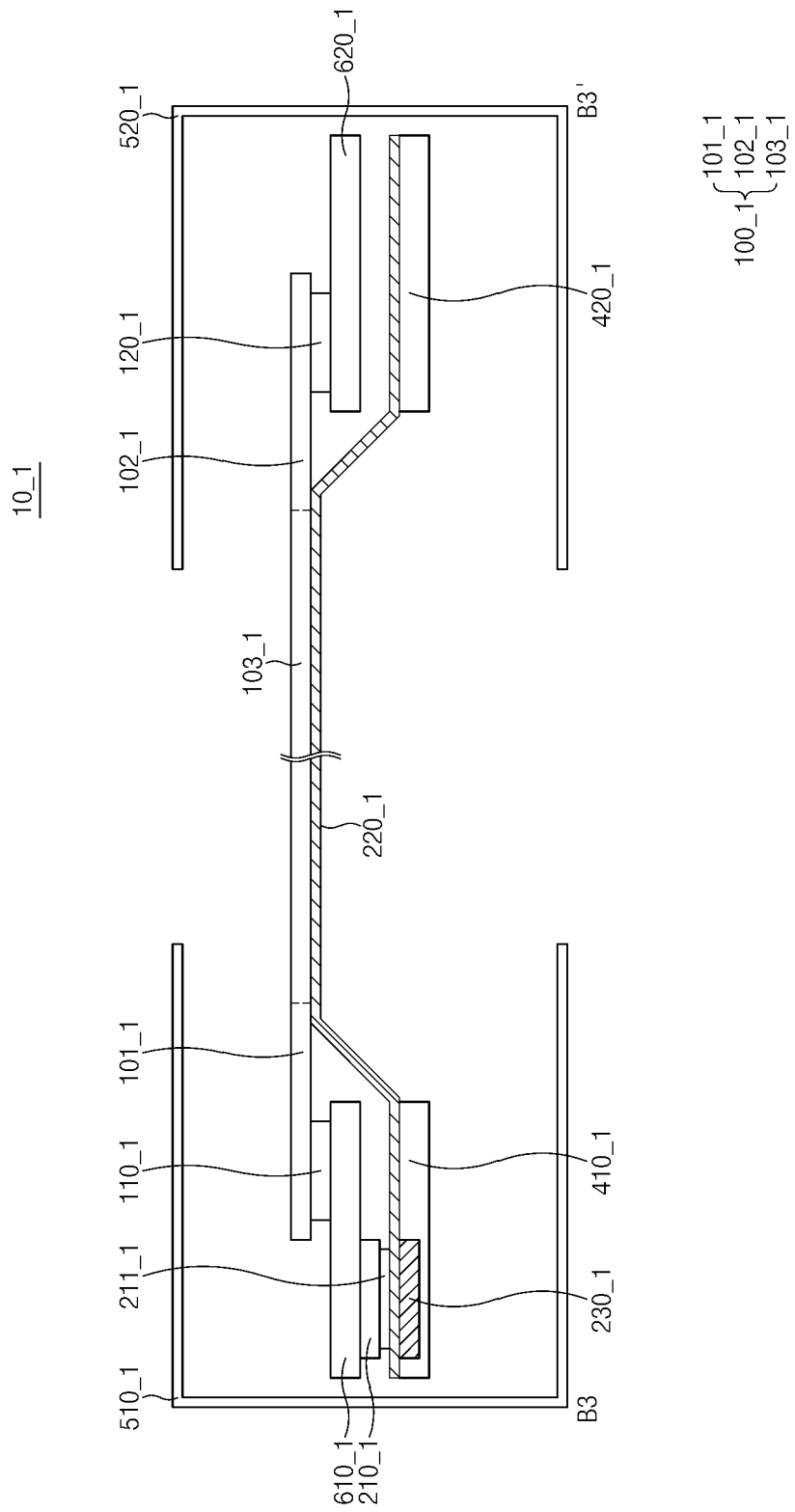
FIG. 4B illustrates a sectional view of the electronic device in FIG. 3 taken along line B3-B3', according to an embodiment.

FIG. 3 illustrates an electronic device according to an embodiment. FIG. 4A illustrates a sectional view of the electronic device in FIG. 3 taken along line B2-B2', according to an embodiment. FIG. 4B illustrates a sectional view of the electronic device in FIG. 3 taken along line B3-B3', according to an embodiment.

Referring to FIGS. 3, 4A, and 4B, an electronic device 101 includes a rollable display 100_1. Reference numeral 301 represents a closed state of the electronic device 10_1, and reference numeral 302 represents an open state of the electronic device 10_1.

The electronic device 10_1 includes a first housing structure 510_1, a second housing structure 520_1, and the rollable display 100_1 that is disposed in a space formed by the first housing structure 510_1 and the second housing structure 520_1. In the closed state 301 of the electronic device 10_1, the display 100_1 may be folded or rolled up and may be stored (or received) in the space formed by the first housing structure 501_1 and the second housing structure 520_1. In the open state 302 of the electronic device 10_1, the display 100_1 may be unfolded or unrolled and may display a screen.

The display 100_1 includes a first area 101_1 fixed to the first housing structure 510_1, a second area 102_1 fixed to the second housing structure 520_1, and a rolling area 103_1 located between the first area 101_1 and the second area 102_1. In the closed state 301, the rolling area 103_1 may be stored (or received) in the space formed by the first housing structure 510_1 and the second housing structure 520_1, and in the open state 302, the rolling area 103_1 may be exposed to the outside.

The first housing structure 510_1 includes a first circuit board 610_1 disposed near a first bracket 410_1. The second housing structure 520_1 includes a second circuit board 620_1 disposed near a second bracket 420_1. At least a portion of the first housing structure 510_1 and at least a portion of the second housing structure 520_1 may be formed of a metallic material or a non-metallic material that has a stiffness selected to support the display 100_1. A portion of the display 100_1 may be connected to the first circuit board 610_1 through a first display connector 110_1. Another portion of the display 100_1 may be connected to the second circuit board 620_1 through a second display connector 120_1.

Various components of the electronic device 10_1 may be mounted on the first circuit board 610_1 and the second circuit board 620_1. For example, a heat source 210_1 (e.g., an AP, a CP, or a PMIC) that generates a relatively large amount of heat is mounted on the first circuit board 610_1. However, the arrangement, shape, and size of the heat source 210_1 are not limited to the illustrated example. For example, the heat source 210_1 may be disposed on the second circuit board 620_1, or may be disposed on both the first circuit board 610_1 and the second circuit board 620_1.

The electronic device 10_1 includes a heat-dissipation path structure 220_1 across the first housing structure 510_1, the display 100_1, and the second housing structure 520_1. For example, the electronic device 10_1 includes the heat-dissipation path structure 220_1 extending from the first bracket 410_1 to the second bracket 420_1 (or from the second bracket 420_1 to the first bracket 410_1). For example, the heat-dissipation path structure 220_1 extends along the display 100_1 and may be connected with (or brought into contact with) the first bracket 410_1 and the second bracket 420_1. The first bracket 410_1 may include a metal portion and an injection-molded portion. A portion of the heat-dissipation path structure 220_1 may be connected with the metal portion of the first bracket 410_1. The second bracket 420_1 may include a metal portion and an injection-molded portion. A portion of the heat-dissipation path structure 220_1 may be connected with the metal portion of the second bracket 420_1. The metal portion of the first bracket 410_1 or the metal portion of the second bracket 420_1 may serve as a heat sink. In the closed state 301, the heat-dissipation path structure 220_1 may be folded or rolled up in a form (or way) that is the same as, or similar to, that of the display 100_1.

A portion of the heat-dissipation path structure 220_1 may be connected to the heat source 210_1. For example, a heat dissipation member 211_1 (e.g., a TIM) is disposed between the portion of the heat-dissipation path structure 220_1 and the heat source 210_1. The portion of the heat-dissipation path structure 220-1 may be connected with (or brought into contact with) one surface of the heat dissipation member 211_1. The heat source 210_1 may be connected with an opposite surface that is opposite to the one surface of the heat dissipation member 211_1 with which the heat-dissipation path structure 220_1 is brought into contact. The portion of the heat-dissipation path structure 220_1 may be directly connected with the heat source 210_1.

A portion of the heat-dissipation path structure 220_1 may be connected with a heat pipe 230_1 that diffuses heat. The heat source 210_1 may be connected with one surface of the heat-dissipation path structure 220_1, and the heat pipe 230_1 may be connected with an opposite surface that is opposite to the one surface of the heat-dissipation path structure 220_1 with which the heat source 210_1 is connected.

The heat-dissipation path structure 220_1 may be formed in a layered structure including a plurality of layers. For example, the heat-dissipation path structure 220_1 may include a heat conduction layer formed of a material (e.g., graphite, copper, or the like) that has a relatively high heat transfer rate and one or more cover layers for maintaining the stiffness of the heat conduction layer. The cover layers may be disposed on the top and bottom of the heat conduction layer. The cover layers disposed on the top and bottom of the heat conduction layer may be disposed to surround the heat conduction layer in a sealed pouch form. The thicknesses of the cover layers may partially vary depending on a location on the heat-dissipation path structure 220_1. In a portion of the heat-dissipation path structure 220_1 that corresponds to the display 100_1, the cover layers may be thicker than in a portion of the heat-dissipation path structure 220_1 that corresponds to the first bracket 410_1 or the second bracket 420_1. In the thicker portions of the cover layers, the cover layers may be constituted by a plurality of cover layers.

The heat-dissipation path structure 220_1 may diffuse, through the heat conduction layer, heat generated from the heat source 210_1. On one side of the first bracket 410_1, the heat-dissipation path structure 220_1 may diffuse the generated heat. For example, the generated heat may be transferred to the heat-dissipation path structure 220_1 through the heat dissipation member 211_1. The heat-dissipation path structure 220_1 may diffuse the heat transferred from the heat source 210_1. The heat-dissipation path structure 220_1 may transfer the transferred heat to the heat pipe 230_1. On one side of the first bracket 410_1, the heat pipe 230_1 may diffuse the transferred heat. The heat-dissipation path structure 220_1 may diffuse the transferred heat through the metal portion of the first bracket 410_1.

The heat-dissipation path structure 220_1 may diffuse the transferred heat toward the second bracket 420_1. For example, the heat-dissipation path structure 220_1 may diffuse the transferred heat toward the second bracket 420_1 along the display 100_1. The heat-dissipation path structure 220_1 may diffuse the transferred heat through the metal portion of the second bracket 420_1.

As described above, the electronic device 10_1 may diffuse the heat generated from the heat source 210_1, which is located near the first bracket 410_1, toward the second bracket 420_1 through the heat-dissipation path structure 220_1, and the heat dissipation performance of the electronic device 101 may be improved.

Figure 5:
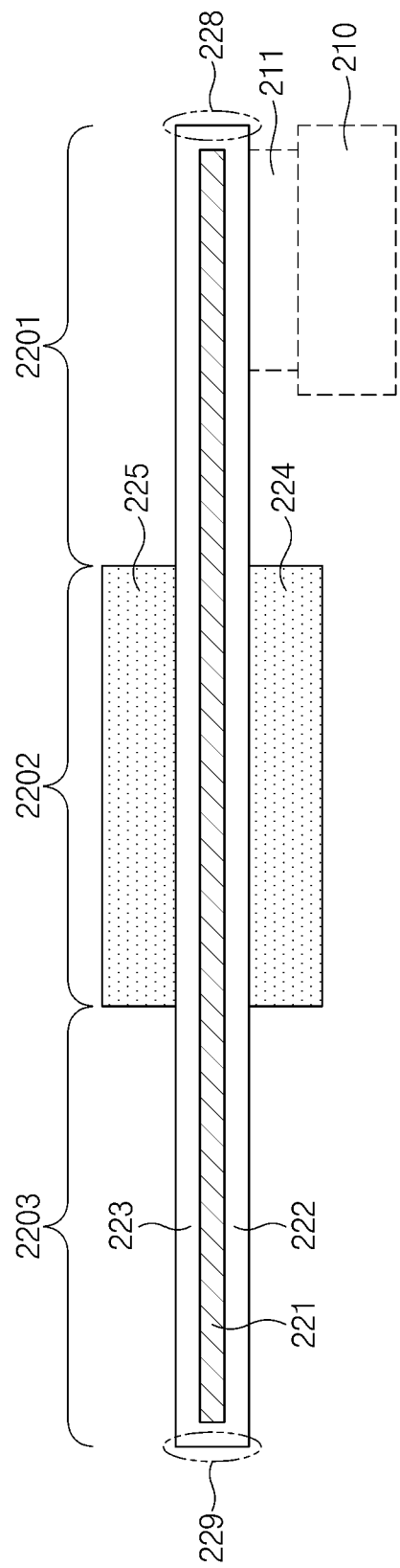
FIG. 5 illustrates a heat-dissipation path structure according to an embodiment.

FIG. 5 illustrates a heat-dissipation path structure according to an embodiment. For example, the heat-dissipation path structure 220 of FIG. 1A may be embodied as illustrated in FIG. 5.

Referring to FIG. 5, the heat-dissipation path structure includes a first structural portion 2201, a second structural portion 2202, and a third structural portion 2203. However, the portions of the heat-dissipation path structure are not limited to the illustrated example of three.

The first structural portion 2201 may be disposed in a first housing portion of an electronic device. The second structural portion 2202 may be disposed through a hinge portion of the electronic device or along a display portion of the electronic device. The third structural portion 2203 may be disposed in a second housing portion of the electronic device. The heat-dissipation path structure may be disposed throughout the first housing portion, the hinge portion (or the display portion), and the second housing portion, and the second structural portion 2202 may be disposed through the hinge portion (or along the display portion).

The first structural portion 2201 may be connected to the heat source 210. For example, the first structural portion 2201 is connected to the heat source 210 through the heat dissipation member 211. One surface of the first structural portion 2201 may be brought into contact with the heat dissipation member 211. One surface of the heat dissipation member 211 may be brought into contact with the heat source 210.

The heat-dissipation path structure is constituted by a plurality of layers. For example, the heat-dissipation path structure includes a heat conduction layer 221, a first cover layer 222 formed (or deposited) on one surface of the heat conduction layer 221, and a second cover layer 223 formed (or deposited) on an opposite surface of the heat conduction layer 221.

The heat conduction layer 221, the first cover layer 222, or the second cover layer 223 may have a uniform thickness over the first to third structural portions 2201 to 2203. The first cover layer 222 and the second cover layer 223 may have different thicknesses. Alternatively, the first cover layer 222 and the second cover layer 223 may have the same thickness. For example, the first cover layer 222 and the second cover layer 223 may have a first specific thickness (e.g., about 5 µm). The first specific thickness may be determined in consideration of the heat transfer rate between the heat source 210 and the heat conduction layer 221. Alternatively, the first specific thickness may be determined in consideration of the heat transfer rate between a heat sink and the heat conduction layer 221.

The second structural portion 2202 may have a different thickness from the first structural portion 2201 or the third structural portion 2203. For example, the second structural portion 2202 may be thicker than the first structural portion 2201 or the third structural portion 2203. An additional cover layer may be formed (or stacked) in the second structural portion 2202. For example, in the second structural portion 2202, the heat conduction layer 221 may be formed (or stacked) on one surface of the first cover layer 222, and a third cover layer 224 may be formed on an opposite surface of the first cover layer 222.

In the second structural portion 2202, the heat conduction layer 221 may be formed on one surface of the second cover layer 223, and a fourth cover layer 225 may be formed on an opposite surface of the second cover layer 223. The third cover layer 224 and the fourth cover layer 225 may have different thicknesses. Alternatively, the third cover layer 224 and the fourth cover layer 225 may have the same thickness. For example, the third cover layer 224 and the fourth cover layer 225 may be thicker than the first cover layer 222 and the second cover layer 223. The third cover layer 224 and the fourth cover layer 225 may have a second specific thickness (e.g., about 50 µm) that is greater than the first specific thickness. The second specific thickness may be determined in consideration of the durability or flexibility based on a movement of the hinge portion.

The heat conduction layer 221 may be formed of graphite or copper. The first to fourth cover layers 222 to 225 may be formed of a polymer compound (e.g., polyethylene terephthalate (PET)). The first cover layer 222 and the second cover layer 223 may be formed of a polymer compound having a higher thermal conductivity than the third cover layer 224 and the fourth cover layer 225. The third cover layer 224 and the fourth cover layer 225 may be formed of a polymer compound having a higher durability or flexibility than the first cover layer 222 and the second cover layer 223.

The first cover layer 222 and the second cover layer 223 may be disposed to surround the heat conduction layer 221 in a pouch form at opposite ends 228 and 229 of the heat-dissipation path structure.

The first structural portion 2201 may be connected with (or brought into contact with) a first heat sink that is included in the first housing portion. The first structural portion 2201 may be connected with a heat pipe that is included in the first housing portion. The third structural portion 2203 may be connected with a second heat sink that is included in the second housing portion.

Figure 6:
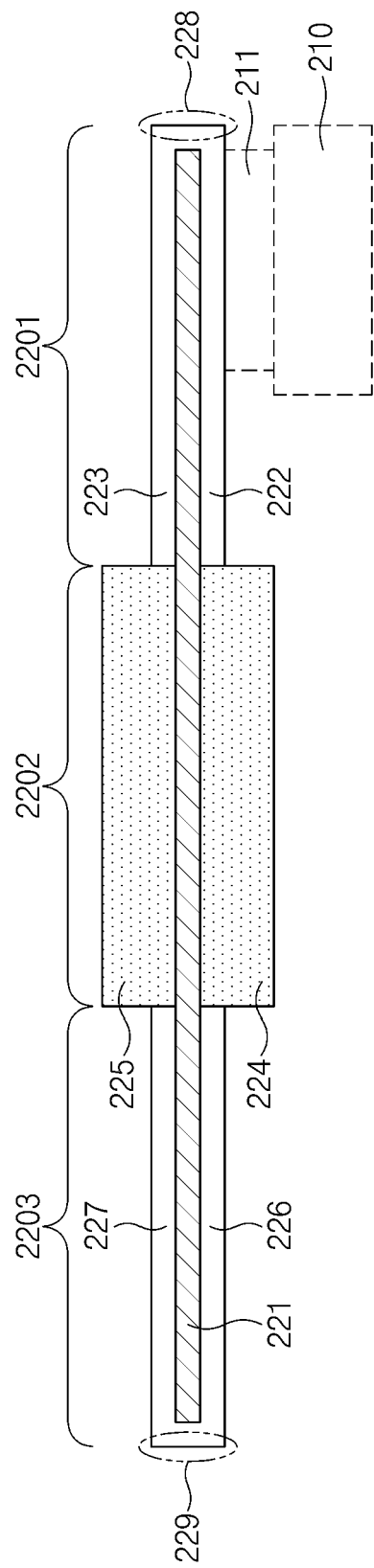
FIG. 6 illustrates a heat-dissipation path structure according to an embodiment.

FIG. 6 illustrates a sectional view of a heat-dissipation path structure according to an embodiment. For example, the heat-dissipation path structure 220 of FIG. 1A may be embodied as illustrated in FIG. 6.

Referring to FIG. 6, the heat-dissipation path structure includes a first structural portion 2201, a second structural portion 2202, and a third structural portion 2203. However, the portions of the heat-dissipation path structure are not limited to the illustrated example of three.

The arrangement of the first structural portion 2201, the second structural portion 2202, and the third structural portion 2203 in an electronic device is the same as, or similar to, the arrangement described above with reference to FIG. 5. Therefore, a repetitive description of these portion is omitted below.

The heat-dissipation path structure is constituted by a plurality of layers. For example, the heat-dissipation path structure 220 includes a heat conduction layer 221, which may have a uniform thickness over the first to third structural portions 2201 to 2203.

In the first structural portion 2201, a first cover layer 222 is formed (or deposited) on one surface of the heat conduction layer 221 and a second cover layer 223 is formed on an opposite surface of the heat conduction layer 221. For example, the first cover layer 222 and the second cover layer 223 may have different thicknesses. Alternatively, the first cover layer 222 and the second cover layer 223 may have the same thickness. For example, the first cover layer 222 and the second cover layer 223 may have a first specific thickness (e.g., about 5 μm). The first specific thickness may be determined in consideration of the heat transfer rate between the heat source 210 and the heat conduction layer 221. Alternatively, the first specific thickness may be determined in consideration of the heat transfer rate between a first heat sink and the heat conduction layer 221.

In the second structural portion 2202, a third cover layer 224 is formed on the one surface of the heat conduction layer 221 and a fourth cover layer 225 is formed on the opposite surface of the heat conduction layer 221. For example, the third cover layer 224 and the fourth cover layer 225 may have different thicknesses. Alternatively, the third cover layer 224 and the fourth cover layer 225 may have the same thickness. For example, the third cover layer 224 and the fourth cover layer 225 may be thicker than the first cover layer 222 or the second cover layer 223. The third cover layer 224 and the fourth cover layer 225 may have a second specific thickness (e.g., about 50 μm) that is greater than the first specific thickness. The second specific thickness may be determined in consideration of the durability or flexibility based on a movement of a hinge portion.

In the third structural portion 2203, a fifth cover layer 226 is formed on the one surface of the heat conduction layer 221 and a sixth cover layer 227 is formed on the opposite surface of the heat conduction layer 221. For example, the fifth cover layer 226 and the sixth cover layer 227 may have different thicknesses. Alternatively, the fifth cover 1o layer 226 and the sixth cover layer 227 may have the same thickness. For example, the fifth cover layer 226 and the sixth cover layer 227 may have a third specific thickness (e.g., about 5 μm). The third specific thickness may be determined in consideration of the heat transfer rate between a second heat sink and the heat conduction layer 221.

The heat conduction layer 221 may be formed of graphite or copper. The first to sixth cover layers 222 to 227 may be formed of a polymer compound. For example, the first cover layer 222, the second cover layer 223, the fifth cover layer 226, and the sixth cover layer 227 may be formed of a polymer compound having a higher thermal conductivity than the third cover layer 224 and the fourth cover layer 225. The third cover layer 224 and the fourth cover layer 225 may be formed of a polymer compound having a higher durability or flexibility than the first cover layer 222, the second cover layer 223, the fifth cover layer 226, and the sixth cover layer 227.

The first cover layer 222 and the second cover layer 223 may be disposed to surround the heat conduction layer 221 in a pouch form at one end 228 of the heat-dissipation path structure. The fifth cover layer 226 and the sixth cover layer 227 may be disposed to surround the heat conduction layer 221 in a pouch form at an opposite end 229 of the heat-dissipation path structure.

Figure 7:
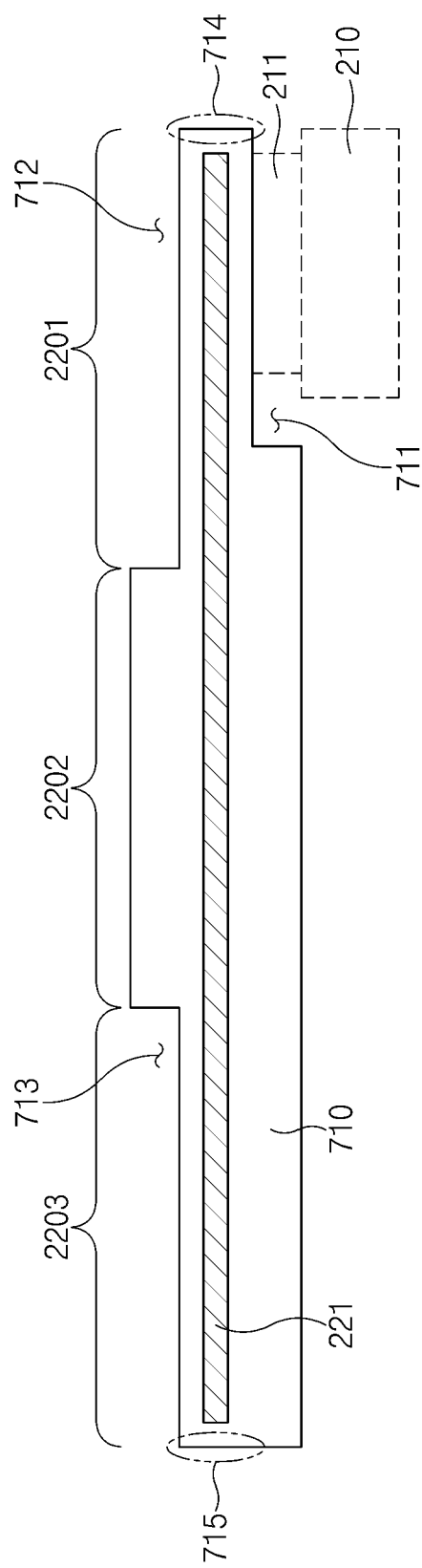
FIG. 7 illustrates a heat-dissipation path structure according to an embodiment.

FIG. 7 illustrates a sectional view of a heat-dissipation path structure according to an embodiment. For example, the heat-dissipation path structure 220 of FIG. 1A may be embodied as illustrated in FIG. 7.

Referring to FIG. 7, the heat-dissipation path structure includes a first structural portion 2201, a second structural portion 2202, and a third structural portion 2203. However, the portions of the heat-dissipation path structure are not limited to the illustrated example of three.

As the arrangement of the first structural portion 2201, the second structural portion 2202, and the third structural portion 2203 in an electronic device is the same as, or similar to, the arrangement described above with reference to FIG. 5, a repetitive description thereabout will be omitted below.

The heat-dissipation path structure may be constituted by an FPCB including a plurality of layers. For example, the heat-dissipation path structure includes a heat conduction layer 221. The heat conduction layer 221 may include at least one conductive layer. The heat conduction layer 221 may have a uniform thickness over the first to third structural portions 2201 to 2203. The heat-dissipation path structure includes a dielectric layer 710 surrounding the heat conduction layer 221.

The heat-dissipation path structure may have partially different thicknesses. For example, in the first structural portion 2201, the dielectric layer 710 may include a first step portion 711 and a second step portion 712. In the third structural portion 2203, the dielectric layer 710 includes a third step portion 713. The first step portion 711, the second step portion 712, and the third step portion 713 may be formed by removing portions of the FPCB having a specific thickness through a cutting process.

The dielectric layer 710 corresponding to the first step portion 711, the dielectric layer 710 corresponding to the second step portion 712, and the dielectric layer 710 corresponding to the third step portion 713 may have different thicknesses. Alternatively, the dielectric layer 710 corresponding to the first step portion 711, the dielectric layer 710 corresponding to the second step portion 712, and the dielectric layer 710 corresponding to the third step portion 713 may have the same thickness (e.g., about 5 µm).

The second structural portion 2202 may have the thicker dielectric layer 710 than the first structural portion 2201 or the third structural portion 2203, and thus the durability or flexibility may be improved. For example, in the remaining portion other than the first step portion 711, the second step portion 712, and the third step portion 713, the dielectric layer 710 may have a specific thickness (e.g., about 50 µm) by stacking FPCBs.

The first step portion 711, the second step portion 712, and the third step portion 713 may have different widths. For example, the first step portion 711 may be formed based on the size of the heat source 210. The second step portion 712 may be formed based on the size of a first heat sink. The third step portion 713 may be formed based on the size of a second heat sink.

The dielectric layer 710 may be formed to surround the heat conduction layer 221 in a pouch form at opposite ends 714 and 715 of the heat-dissipation path structure.

Figure 8:
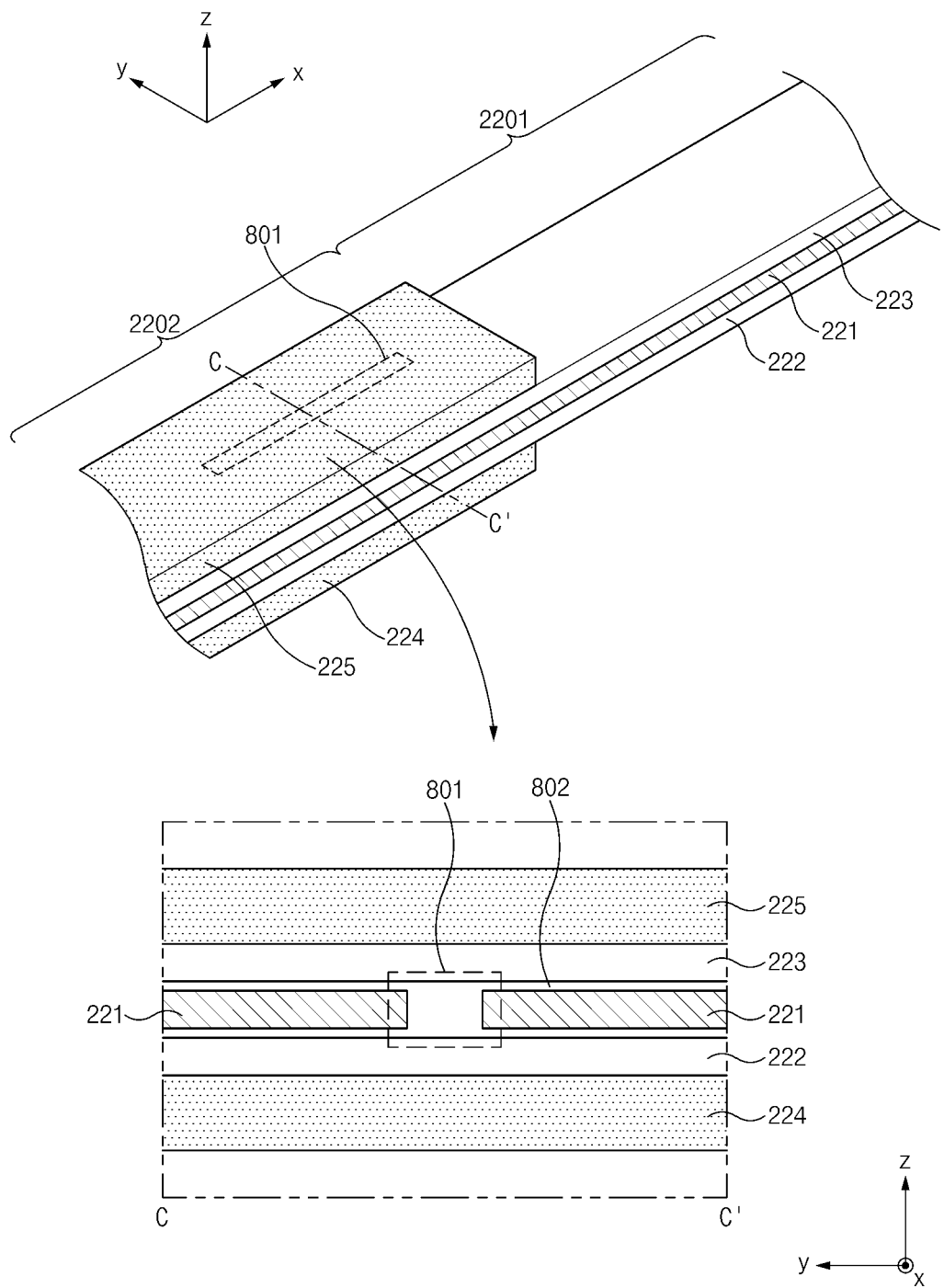
FIG. 8 illustrates a slit structure formed in a heat-dissipation path structure according to an embodiment.

FIG. 8 illustrates a slit structure formed in a heat-dissipation path structure according to an embodiment. For example, the heat-dissipation path structure 220 of FIG. 1A may be embodied as illustrated in FIG. 8.

Referring to FIG. 8, the heat-dissipation path structure is the same as, or similar to, the heat-dissipation path structure of FIG. 5, except for a slit structure 801 that is added thereto. The slit structure 801 may also be applied to the heat-dissipation path structure of FIG. 6.

The heat-dissipation path structure includes the slit structure 801 formed in a second structural portion 2202 in the X-axis direction (e.g., the direction perpendicular to the folding axis A in FIG. 1A). For example, the slit structure 801 is formed in a heat conduction layer 221. A first cover layer 222 and a second cover layer 223 are attached to the heat conduction layer 221 through an adhesive member 802. When the first cover layer 222 and the second cover layer 223 are attached, the slit structure 801 may be filled with the adhesive member 802. Accordingly, when compared with the heat-dissipation path structure in which the slit structure 801 is not present, the first cover layer 222 and the second cover layer 223 are more firmly coupled (or attached) to the heat conduction layer 221, the stiffness of the heat-dissipation path structure in the second structural portion 2202 may be increased, and a possibility of separation of the cover layer (e.g., the first cover layer 222 or the second cover layer 223) by a movement of a hinge portion may be lowered.

Figure 9:
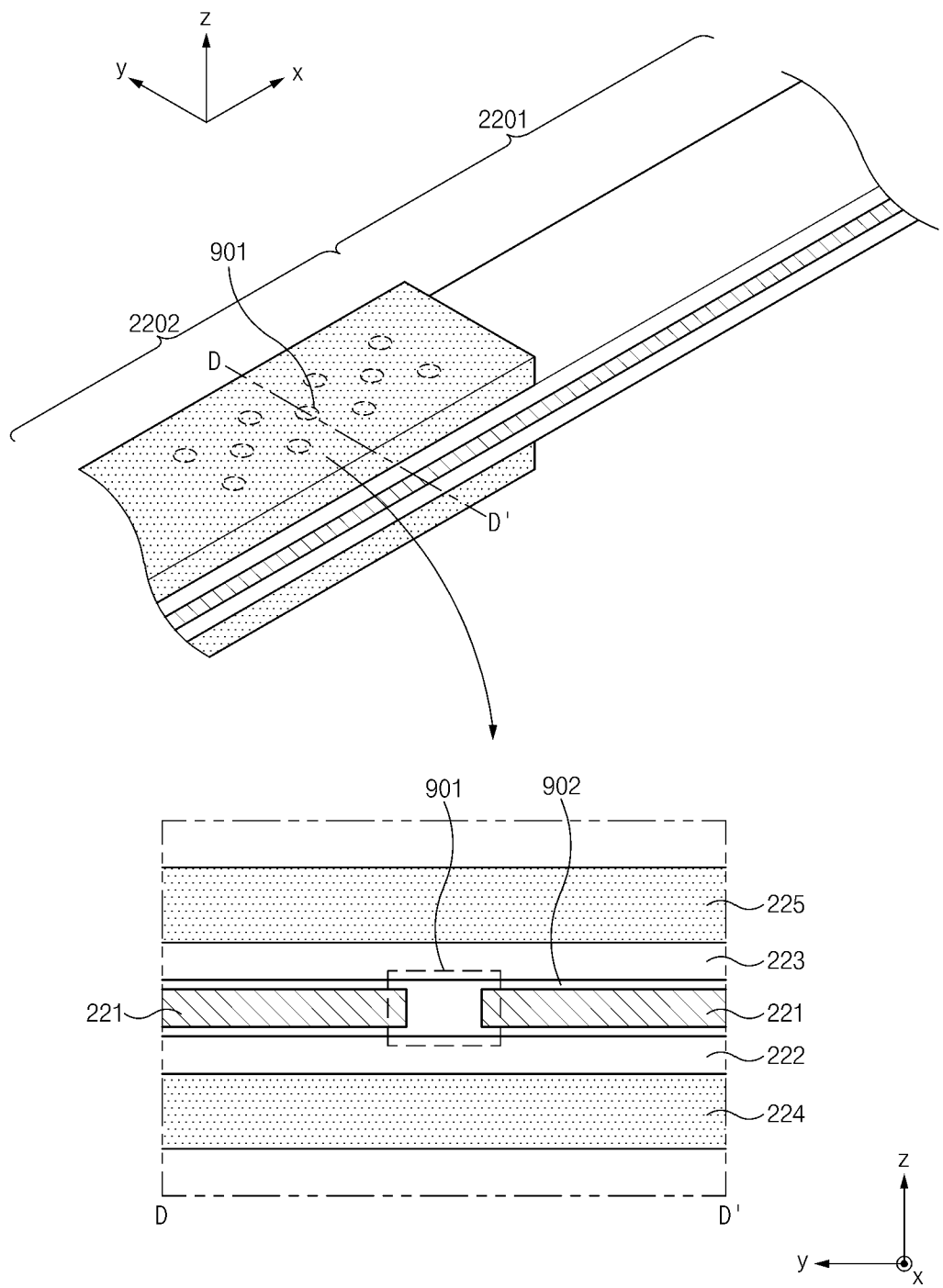
FIG. 9 illustrates a dot structure formed in a heat-dissipation path structure according to an embodiment.

FIG. 9 illustrates a dot structure formed in a heat-dissipation path structure according to an embodiment. For example, the heat-dissipation path structure 220 of FIG. 1A may be embodied as illustrated in FIG. 9.

Referring to FIG. 9, the heat-dissipation path structure is the same as, or similar to, the heat-dissipation path structure of FIG. 5, except for dot structures 901 that are added thereto. The dot structure 901 may also be applied to the heat-dissipation path structure of FIG. 6.

The heat-dissipation path structure includes a plurality of dot structures 901 formed in a second structural portion 2202. For example, the dot structures 901 are formed in a heat conduction layer 221. A first cover layer 222 and a second cover layer 223 are attached to the heat conduction layer 221 through an adhesive member 902. When the first cover layer 222 and the second cover layer 223 are attached, the dot structures 901 may be filled with the adhesive member 902. Accordingly, when compared with a heat-dissipation path structure in which the dot structures 901 are not present, the first cover layer 222 and the second cover layer 223 may be more firmly coupled (or attached) to the heat conduction layer 221, the stiffness of the heat-dissipation path structure 220 in the second structural portion 2202 may be increased, and a possibility of separation of the cover layer (e.g., the first cover layer 222 or the second cover layer 223) by a movement of a hinge portion may be lowered.

Figure 10:
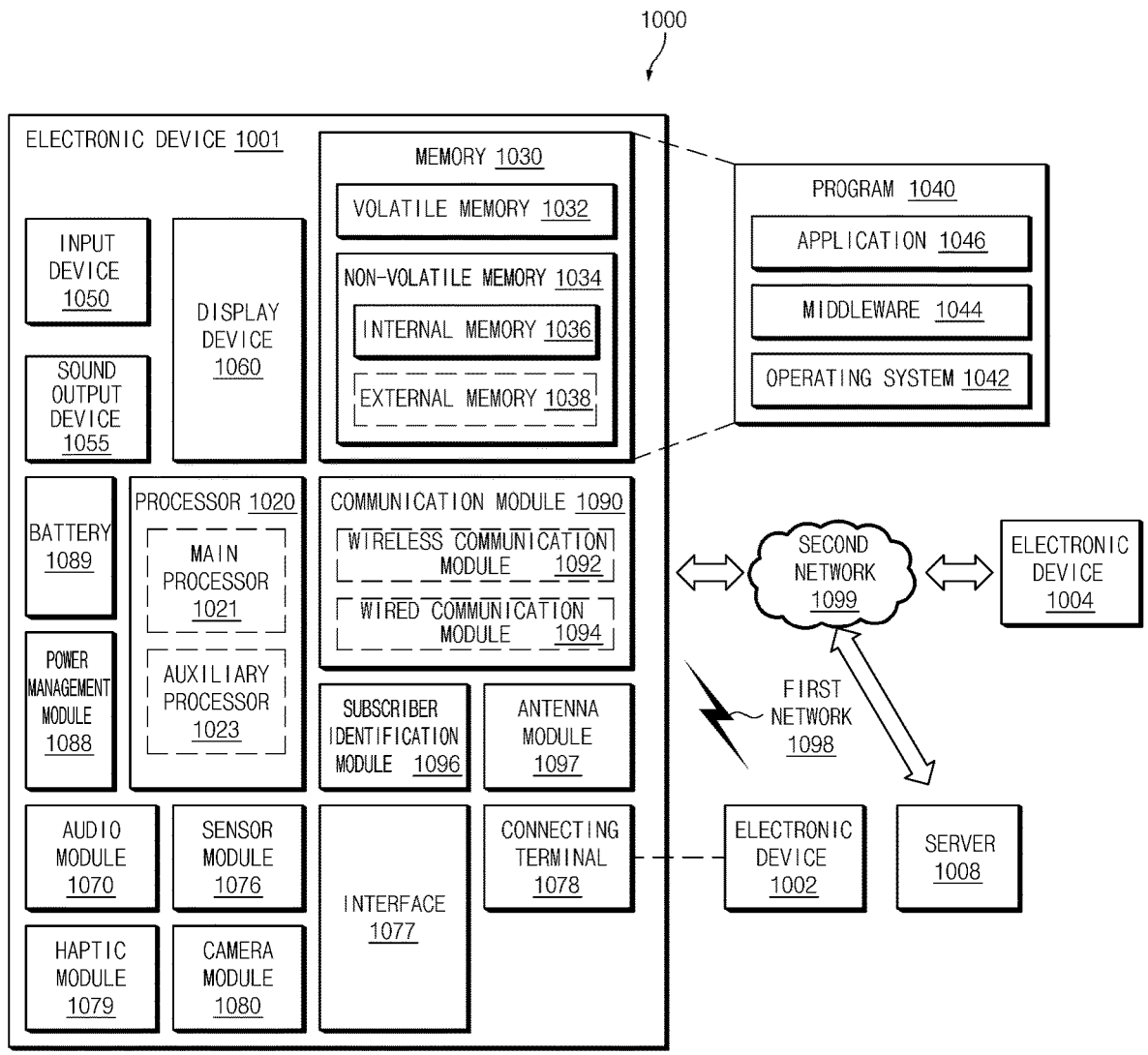
FIG. 10 is a block diagram illustrating an electronic device in a network environment according to various embodiments.

FIG. 10 illustrates an electronic device 1001 in a network environment 1000 according to an embodiment.

Referring to FIG. 10, the electronic device 1001 in the network environment 1000 may communicate with an electronic device 1002 via a first network 1098 (e.g., a short-range wireless communication network), or an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module (SIM) 1096, or an antenna module 1097. In some embodiments, at least one (e.g., the display device 1060 or the camera module 1080) of the components may be omitted from the electronic device 1001, or one or more other components may be added in the electronic device 1001. In some embodiments, some of the components may be implemented as single integrated circuitry. For example, the sensor module 1076 (e.g., a fingerprint sensor, an iris sensor, or an illuminance sensor) may be implemented as embedded in the display device 1060 (e.g., a display).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may load a command or data received from another component (e.g., the sensor module 1076 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an AP), and an auxiliary processor 1023 (e.g., a graphics processing unit (GPU), an image signal processor (ISP), a sensor hub processor, or a CP) that is operable independently from, or in conjunction with, the main processor 1021. Additionally or alternatively, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an ISP or a CP) may be implemented as part of another component (e.g., the camera module 1080 or the communication module 1090) functionally related to the auxiliary processor 1023.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by other component (e.g., the processor 1020) of the electronic device 1001, from the outside (e.g., a user) of the electronic device 1001. The input device 1050 may include, for example, a microphone, a mouse, a keyboard, or a digital pen (e.g., a stylus pen).

The sound output device 1055 may output sound signals to the outside of the electronic device 1001. The sound output device 1055 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1060 may visually provide information to the outside (e.g., a user) of the electronic device 1001. The display device 1060 may include, for example, a display, a hologram device, or a projector and control circuitry to control a corresponding one of the display, hologram device, and projector. According to an embodiment, the display device 1060 may include touch circuitry adapted to detect a touch, or sensor circuitry (e.g., a pressure sensor) adapted to measure the intensity of force incurred by the touch.

The audio module 1070 may convert a sound into an electrical signal and vice versa. According to an embodiment, the audio module 1070 may obtain the sound via the input device 1050, or output the sound via the sound output device 1055 or a headphone of an external electronic device (e.g., an electronic device 1002) directly (e.g., wiredly) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, an HDMI connector, a USB connector, an SD card connector, or an audio connector (e.g., a headphone connector).

The haptic module 1079 may convert an electrical signal into a mechanical stimulus (e.g., a vibration or a movement) or electrical stimulus which may be recognized 1o by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, ISPs, or flashes.

The power management module 1088 may manage power supplied to the electronic device 1001. According to one embodiment, the power management module 1088 may be implemented as at least part of, for example, a PMIC.

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more CPs that are operable independently from the processor 1020 (e.g., the AP) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., a PCB). According to an embodiment, the antenna module 1097 may include a plurality of antennas. In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. According to an embodiment, all or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory storage medium" means a tangible device, and does not include a signal (e.g., an electromagnetic wave), but this term does not differentiate between where data is semi-permanently stored in the storage medium and where the data is temporarily stored in the storage medium. For example, "the non-transitory storage medium" may include a buffer where data is temporally stored.

A method according to various embodiments of the disclosure may be included and provided in a computer program product. The computer program product may be traded as a product between a seller and a buyer. The computer program product (e.g., downloadable app)) may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to the above-described embodiments, a heat dissipation operation may be rapidly performed by using a space of the flexible display device, performance degradation of the flexible display device due to heat generation may be prevented, and an unpleasant feeling and a low-temperature burn of a user may be prevented through rapid heat dissipation.

In addition, the disclosure may provide various effects that are directly or indirectly recognized.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A flexible display device, comprising:
   a first housing;
   a second housing;
   a hinge structure configured to connect the first housing and the second housing and support a hinge motion of the first housing or the second housing;
   a heat source disposed in the first housing;
   a heat sink disposed in the second housing; and
   a heat-dissipation path structure disposed across the first housing, the hinge structure, and the second housing,
   wherein the heat-dissipation path structure transfers heat generated by the heat source to the heat sink, and
   wherein a first portion of the heat-dissipation path structure corresponding to the hinge structure has a different thickness than a second portion of the heat-dissipation path structure corresponding to the first housing or the second housing.

2. The flexible display device of claim 1, wherein at least a portion of the heat-dissipation path structure is disposed to pass through at least a portion of the hinge structure.

3. The flexible display device of claim 1, wherein the heat-dissipation path structure comprises:
   a heat conduction layer that transfers the heat generated by the heat source; and
   a cover layer that surrounds the heat conduction layer.

4. The flexible display device of claim 3, wherein the heat-dissipation path structure further comprises:
   a first structural portion corresponding to the first housing;
   a second structural portion corresponding to the hinge structure; and
   a third structural portion corresponding to the second housing.

5. The flexible display device of claim 4, wherein the heat conduction layer has a uniform thickness in the first structural portion, the second structural portion, and the third structural portion.

6. The flexible display device of claim 4, wherein a first portion of the cover layer included in the second structural portion has a greater thickness than a second portion of the cover layer included in the first structural portion or the third structural portion.

7. The flexible display device of claim 1, wherein the heat-dissipation path structure comprises:
   a heat conduction layer that transfers the heat generated by the heat source;
   a first structural portion corresponding to the first housing;
   a second structural portion corresponding to the hinge structure;
   a third structural portion corresponding to the second housing;
   a first cover layer disposed on a first surface of the heat conduction layer; and
   a second cover layer disposed on a second surface of the heat conduction layer,
   wherein the second surface is opposite the first surface, and
   wherein the first cover layer or the second cover layer has a uniform thickness in the first structural portion, the second structural portion, and the third structural portion.

8. The flexible display device of claim 7, wherein the heat-dissipation path structure further comprises:
   a third cover layer disposed on the first cover layer in the second structural portion; and
   a fourth cover layer disposed on the second cover layer in the second structural portion, and
   wherein the third cover layer or the fourth cover layer has a greater thickness than the first cover layer or the second cover layer.

9. The flexible display device of claim 8, wherein the first cover layer and the second cover layer are formed of a polymer compound having a higher thermal conductivity than the third cover layer and the fourth cover layer.

10. The flexible display device of claim 8, wherein the third cover layer and the fourth cover layer are formed of a polymer compound having a higher durability or flexibility than the first cover layer and the second cover layer.

11. The flexible display device of claim 7, wherein the heat conduction layer comprises a slit structure formed in the second structural portion,
    wherein the first cover layer and the second cover layer are attached to the heat conduction layer by an adhesive member, and
    wherein the slit structure is filled with the adhesive member.

12. The flexible display device of claim 11, wherein the slit structure is formed in a direction perpendicular to a folding axis of the hinge structure.

13. The flexible display device of claim 7, wherein the heat conduction layer comprises a plurality of dot structures formed in the second structural portion,
    wherein the first cover layer and the second cover layer are attached to the heat conduction layer by an adhesive member, and
    wherein the plurality of dot structures are filled with the adhesive member.

14. The flexible display device of claim 1, wherein the heat-dissipation path structure comprises:
    a heat conduction layer that transfers the heat generated by the heat source;
    a first structural portion corresponding to the first housing;
    a second structural portion corresponding to the hinge structure;

a third structural portion corresponding to the second housing;
a first cover layer formed on a first surface of the heat conduction layer in the first structural portion;
a second cover layer formed on a second surface of the heat conduction layer in the first structural portion;
a third cover layer formed on a third surface of the heat conduction layer in the second structural portion; and
a fourth cover layer formed on a fourth surface of the heat conduction layer in the second structural portion,
wherein the second surface is opposite the first surface,
wherein the fourth surface is opposite the third surface,
wherein the first cover layer and the second cover layer have a first thickness, and
wherein the third cover layer and the fourth cover layer have a second thickness that is greater than the first thickness.

15. The flexible display device of claim 14, wherein the heat-dissipation path structure further comprises:
a fifth cover layer formed on a fifth surface of the heat conduction layer in the third structural portion; and
a sixth cover layer formed on a sixth surface of the heat conduction layer in the third structural portion,
wherein the sixth surface is opposite the fifth surface, and
wherein the fifth cover layer and the sixth cover layer have the first thickness.

16. The flexible display device of claim 1, wherein the heat-dissipation path structure comprises a flexible printed circuit board including a heat conduction layer and a dielectric layer,
wherein a first portion of the dielectric layer corresponding to the hinge structure has a different thickness than a second portion of the dielectric layer corresponding to the first housing or the second housing, and
wherein the heat conduction layer has a uniform thickness.

17. The flexible display device of claim 16, wherein the second portion of the dielectric layer corresponding to the first housing includes a step corresponding to a size of the heat source.

18. The flexible display device of claim 1, further comprising a second heat sink disposed in the first housing,
wherein at least a portion of the heat-dissipation path structure contacts at least one surface of the second heat sink.

19. The flexible display device of claim 1, further comprising a heat pipe disposed in the first housing or the second housing,
wherein at least a portion of the heat-dissipation path structure contacts at least one surface of the heat pipe.

* * * * *